United States Patent [19]
Yuyama et al.

[11] Patent Number: 5,117,277
[45] Date of Patent: May 26, 1992

[54] SEMICONDUCTOR INTEGRATED CIRCUIT DEVICE WITH IMPROVED CONNECTION PATTERN OF SIGNAL WIRINGS

[75] Inventors: Kyoji Yuyama, Shiroyama; Mikinori Kawaji, Hino, both of Japan

[73] Assignee: Hitachi, Ltd., Tokyo, Japan

[21] Appl. No.: 469,397

[22] Filed: Jan. 24, 1990

[30] Foreign Application Priority Data

Jan. 27, 1989 [JP] Japan ..................... 1-16133

[51] Int. Cl.$^5$ ...................... H01L 21/82; H01L 27/04
[52] U.S. Cl. .......................... 357/71; 357/45; 357/34; 357/41; 357/42
[58] Field of Search ................ 357/71, 34, 45, 42, 357/41

[56] References Cited

U.S. PATENT DOCUMENTS

| | | | |
|---|---|---|---|
| 4,566,022 | 1/1986 | Kalter et al. | 351/45 |
| 4,651,183 | 3/1987 | Lange et al. | 351/45 |
| 4,780,753 | 10/1988 | Ohkura et al. | 357/45 |
| 4,825,273 | 4/1989 | Arakawa | 357/45 |
| 4,833,513 | 5/1989 | Sasaki | 351/41 |
| 4,893,170 | 1/1990 | Tokuda et al. | 357/71 |

FOREIGN PATENT DOCUMENTS

| | | | |
|---|---|---|---|
| 58-51537 | 3/1983 | Japan | 351/45 M |
| 58-64047 | 4/1983 | Japan | 357/45 M |
| 58-197747 | 11/1983 | Japan | . |
| 59-86248 | 5/1984 | Japan | 357/45 |
| 59-143342 | 8/1984 | Japan | . |
| 59-204254 | 11/1984 | Japan | 357/45 |
| 59-220949 | 12/1984 | Japan | 357/45 M |
| 60-12742 | 1/1985 | Japan | 357/45 |
| 60-62136 | 4/1985 | Japan | . |
| 62-71264 | 4/1987 | Japan | 357/45 |
| 62-158359 | 7/1987 | Japan | . |

Primary Examiner—Andrew J. James
Assistant Examiner—Viet Q. Nguyen
Attorney, Agent, or Firm—Antonelli, Terry Stout & Kraus

[57] ABSTRACT

A semiconductor integrated circuit device having a plurality of first wirings that are formed on a semiconductor substrate and extend in a first direction and a plurality of second wirings that extend in a second direction defining an acute angle relative to the first direction. The plurality of first and second wirings have at their ends connection portions of a regular hexagonal shape or a circular shape.

14 Claims, 6 Drawing Sheets

SEMICONDUCTOR INTEGRATED CIRCUIT DEVICE WITH IMPROVED CONNECTION PATTERN OF SIGNAL WIRINGS

BACKGROUND OF THE INVENTION

The present invention relates to a semiconductor integrated circuit device, and particularly to art that can be effectively adapted to a semiconductor integrated circuit device that employs a master slice system.

In a semiconductor integrated circuit device employing a master slice system, signal wirings of a plurality of layers make connections in standard cells and among the standard cells that are regularly arranged in the form of a matrix. Though the functions and arrangement of the standard cells are nearly fixed, the connection pattern of the signal wirings can be modified for every logic that is required. That is, employment of a master slice system makes it possible to develop a various kinds of semiconductor integrated circuit devices in short periods of time only by modifying the connection pattern.

In a semiconductor integrated circuit device employing a master slice system, the connection pattern of the signal wirings is formed by an automatic arranging/routing system (DA: Design Automation) assisted by a computer. The automatic arranging/routing system carries out the following processing.

First, based on logic circuit diagrams that are designed, the logic circuit data are input in the automatic arranging/routing system.

Next, the automatic arranging/routing system arranges a standard cell pattern stored in the base data as a fixed pattern on the semiconductor integrated circuit device (base chip) that is virtually illustrated. Then, based upon the logic circuit data, the connection pattern of the logic circuit is arranged according to the arrangement of the basic cell pattern (wirings in the standard cells). The connection pattern of the logic circuit constitutes the logic circuit or part of the logic circuit. The connection pattern of the logic circuit is automatically arranged by the automatic arranging/routing system.

Next, the automatic arranging/routing system connects the individual logic circuits via the signal wirings to complete a logic circuit to be mounted on the semiconductor integrated circuit device. The signal wiring is automatically arranged on wiring channel regions. In the wiring channel regions, virtual X-Y lattices (called X-Y mesh) are employed. The X-Y lattices comprise two sets of lattice elements which cross each other at right angles and which have equal lattice intervals. The signal wirings are set along the X-Y lattices by the automatic arranging/routing system.

Then, the logic data completed by the automatic arranging/routing system are converted by the automatic arranging/routing system into data for preparing a mask based on design rules, e.g., device process rules that determine the widths of the signal wirings, minimum gaps among the wirings, and so on.

A mask for connection is formed by, for example, an electron beam lithography device based on the data for preparing the mask. Using the mask for connection, the device processing is carried out to complete a semiconductor integrated circuit device mounting a predetermined logic.

In the semiconductor integrated circuit device which employs the master slice system, the signal wiring of two layers, for example, constitute a connection pattern. Of the two layers of the wirings, the first layer extends in X-direction with the wirings thereof being arranged at equal intervals in the Y-direction perpendicular to the X-direction. The second layer extends in the Y-direction includes a plurality of wirings arranged at equal intervals in the X-direction. The signal wirings of the first and second layers are electrically connected to each other at their crossing portions through connection holes formed in an interlayer insulating film between the first and second layers of the signal wirings. The signal wirings are made of an aluminum alloy, for example.

The portions where the first and second layers are connected together constitute so-called dog bones. The word "dog bone" stands for a shape of the wiring having square portions which are wider than the wiring portions and where the connection holes are formed in order to provide margins for mask alignment between the first and second layers in the step of fabrication.

The semiconductor integrated circuit device employing the master slice system is disclosed in, for example, Japanese Patent Laid-open No. 34039/1985.

SUMMARY OF THE INVENTION

In dealing with the semiconductor integrated circuit devices employing the aforementioned master slice system, the present inventors have found the problems that are described below.

The pitch of the signal wirings of the first layer (distance among the center lines of the signal wirings) is determined by taking into consideration the portions where the first and second layers are connected to each other. Similarly, the pitch among the signal wirings of the second layer (distance among the center lines of the signal wirings) is determined by the portions where the first and second layers are connected to each other. That is, the pitch among the wirings is so set that there is sufficient distance between neighboring connection portions to permit processing of the connection portions. Therefore, the connection portions have a maximum wiring width and a minimum distance (minimum space among the wirings) is maintained among the connection portions. As described above, in the case of the semiconductor integrated circuit device employing the master slice system which uses the wiring of a dog bone shape, all the lattice points which are the intersecting points in the X-Y lattice can be set as regions where the connection portions can be arranged. Accordingly, the pitches of the signal wirings of the first and second layers must be greater than a minimum working size, and wide wiring channel regions are required to provide the signal wirings. Therefore, the semiconductor integrated circuit device that employs the master slice system has a lowered degree of integration.

The object of the present invention is to provide technology capable of increasing the degree of integration of the semiconductor integrated circuit device that employs the master slice system by decreasing the area for the provision of the wiring channel regions.

The above and other objects as well as novel features of the present invention will become obvious from the description of the specification and the accompanying drawings.

Among the inventions disclosed in the present application, representative examples will now be described briefly.

A semiconductor integrated circuit device employing a master slice system, wherein on first wirings that extend in a first direction and that are arranged in a plural number maintaining a predetermined distance, there are provided second wirings that extend in a second direction to intersect said first direction and that are arranged in a plural number maintaining a predetermined distance, and the first wirings and the second wirings are electrically connected together at the intersecting portions of said first wirings and said second wirings, and wherein the second direction in which said second wirings extend defines an acute angle or an obtuse angle with respect to the first direction in which said first wirings extend.

Here, the acute angle is 60 degrees and the obtuse angle is 120 degrees.

The plurality of second wirings all intersect the first wirings at an acute angle or at an obtuse angle.

Further, the first wirings and the second wirings are constituted at least as signal wirings for connecting the standard cells.

In the standard cells, furthermore, there are arranged a wiring that extends in parallel with the first direction in which the first wirings extend and a wiring that extends in a direction crossing the first direction.

According to the aforementioned means, the distance is reduced among the first wirings that extend in the first direction and the area for the wiring channel regions where the first wirings are arranged is reduced, too, making it possible to increase the degree of integration of the semiconductor integrated circuit device that employs the master slice system.

DESCRIPTION OF THE PREFERRED EMBODIMENTS

Constitution of the present invention will now be described by way of embodiments in which the present invention is adapted to a semiconductor integrated circuit device that employs a master slice system.

In all of the drawings for explaining the embodiments, those having the same functions are denoted by the same reference numerals and their descriptions are not repeated.

Figure 2:
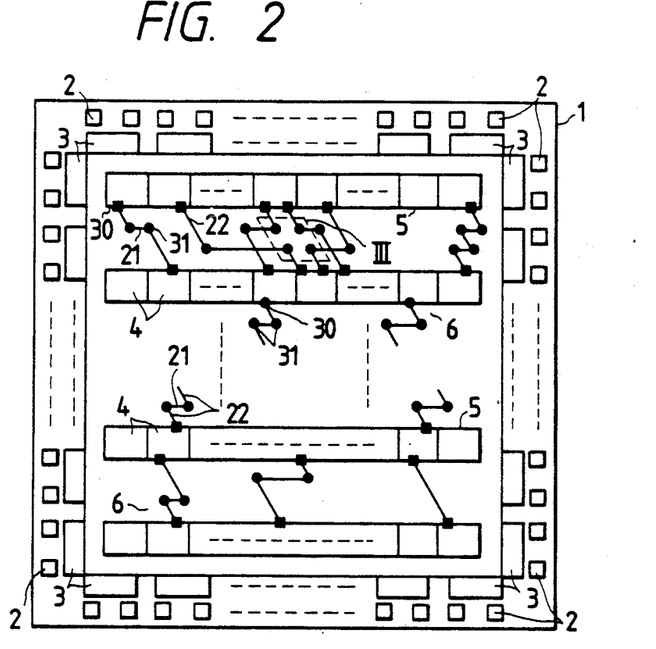
FIG. 2 is a diagram of the chip layout which schematically illustrates the whole structure of the semiconductor integrated circuit device.

FIG. 2 (diagram of the chip layout) schematically illustrates the whole constitution of a semiconductor integrated circuit device employing a master slice system of an embodiment I according to the present invention.

As shown in FIG. 2, the semiconductor integrated circuit device 1 that employs a master slice system is made by providing a plurality of MISFETs and plural wiring layers on the main surface of a chip (semiconductor substrate 10) having a square shape when viewed from above. The semiconductor integrated circuit device 1 has a plurality of external terminals (bonding pads) 2 and a plurality of input/output buffer circuits 3 in the peripheries along the sides of the square chip.

Though there is no limitation in the number of wiring layers, the semiconductor integrated circuit device 1 employing a master slice system of this embodiment has wirings of two layers. Therefore, the above-mentioned external terminals 2 are provided in the upper wiring layer and are formed by a step of forming the second wiring layer. The two wiring layers are composed of aluminum or an aluminum alloy.

The input/output buffer circuits 3 are arranged inside the external terminals 2 at positions corresponding to the external terminal or terminals 2. Though the constitution is not illustrated in detail, each of the input/output buffer circuits 3 consists of a plurality of semiconductor elements such as a plurality of complementary MISFETs (CMOSs). The semiconductor elements in each of the input/output buffer circuits 3 are connected together generally by a wiring (intercellular wiring in the input/output buffer circuit) formed by the step of forming wirings of the first layer.

Though not shown, a main power source wiring extends above the input/output buffer circuit 3. The main power source wiring is formed by the step of forming wirings of the second layer.

A standard cell array (logic circuit portion) that forms a logic circuit is provided in a region at the center of the semiconductor integrated circuit device 1 surrounded by the input/output buffer circuits 3. In the standard cell array are arranged a plurality of standard cells 4 regularly in the form of a matrix. The standard cells 4 are arranged in the X-direction (column direction) to form basic cell columns 5. The standard cell columns 5 are arranged in the Y-direction (row direction) at a predetermined interval via wiring channel regions (wiring-forming regions) 6. The standard cells 4 constitute the logic circuit or part of the logic circuit. In the wiring channel region 6 are arranged signal wirings (21 and 22) that electrically connect the standard cells 4 or the logic circuits. That is, the semiconductor integrated circuit device 1 that employs a master slice system is based on a so-called fixed channel system.

Figure 3:
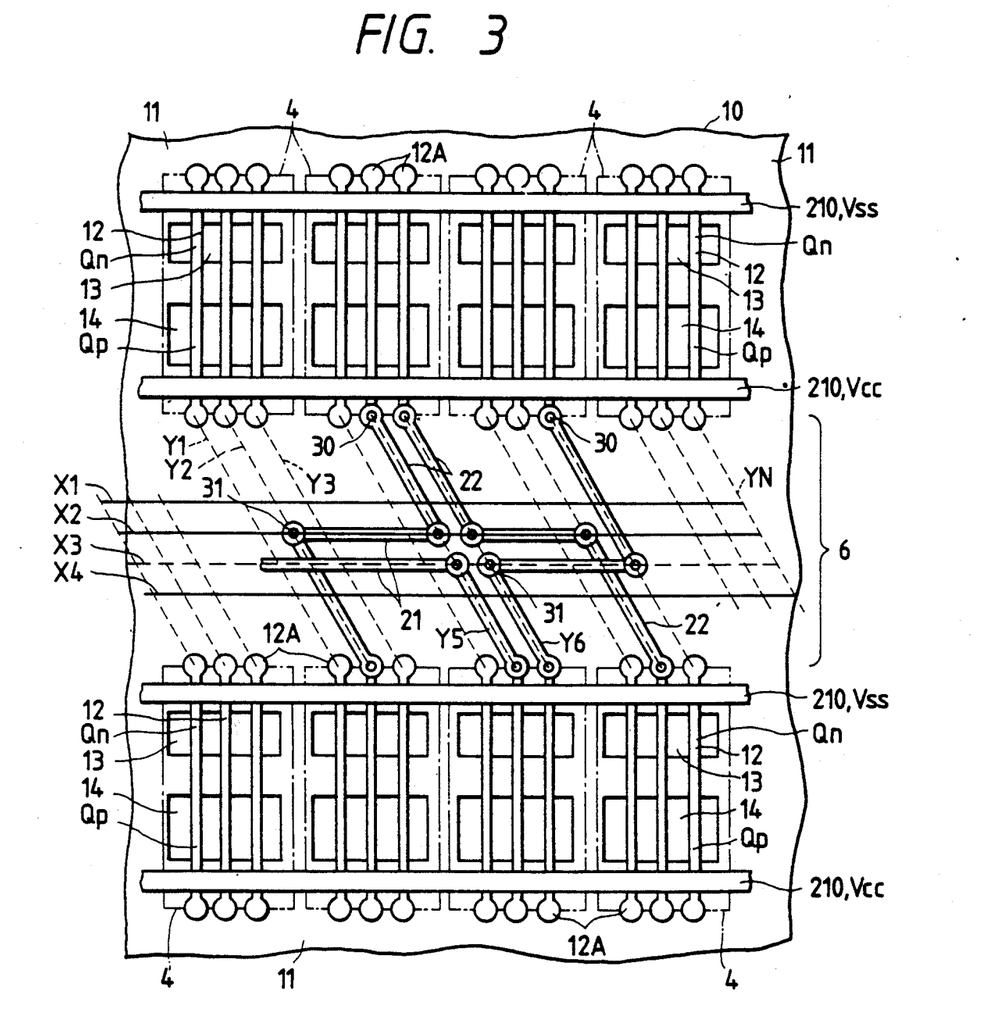
FIG. 3 is an enlarged plan view illustrating the region denoted by III in FIG. 2.

Each of the standard cells 4 consists of three complementary MISFETs (CMOSs) as shown in FIG. 3 (which is an enlarged plan view showing the region denoted by III in FIG. 2). That is, the basic cell 4 is constituted by three p-channel MISFETs Qp and three n-channel MISFETs Qn, with which a three-input NAND gate circuit can be easily formed.

The p-channel MISFET Qp is formed on the main surface of the n-type well region (not shown) in a region whose circumference is defined by a field insulating film 11. The n-type well region is formed on the main surface of the semiconductor substrate 10. The p-channel MISFET Qp is made up mainly of a gate insulating film, a gate electrode 12, and a pair of p+-type semiconductor regions 14 that are a source region and a drain region, respectively.

The n-channel MISFET Qn is formed on the main surface of a p-type well region (not shown) in a region whose circumference is defined by the field insulating film 11. The p-type well region is formed on the main surface of the semiconductor substrate 10. The n-channel MISFET Qn is made up mainly of a gate insulating film, the gate electrode 12, and a pair of n+-type semiconductor regions 13 that are a source region and a drain region respectively.

One p+-type semiconductor region 14 of the p-channel MISFET Qp is formed as a unitary structure together with the other p+-type semiconductor region 14 of the other p-channel MISFET Qp that is neighboring thereto in the longitudinal direction of the gate. That is, the three p-channel MISFETs Qp are so arranged that their gate electrodes 12 are in parallel with one another. Similarly, one n+-type semiconductor region 13 of the n-channel MISFET Qn is formed as a unitary structure together with the other n+-type semiconductor region 13 of the other n-channel MISFET Qn that is neighboring thereto in the longitudinal direction of the gate. That is, the three n-channel MISFETs Qn are so arranged that their gate electrodes 12 are in parallel with each other.

One end of the gate electrode 12 of the p-channel MISFET Qp and one end of the gate electrode 12 of the n-channel MISFET Qn are formed as a unitary structure and are electrically connected to each other. The other end of the gate electrode 12 has a flat shape of a size greater than other portions, e.g., greater than the gate length, and is used as a terminal 12A for input signals of the standard cell 4 or of the logic circuit. To the terminal 12A is electrically connected through a connection hole 30 a signal wiring 21 or 22 that is arranged on the wiring channel region 6. That is, the terminal 12A has a size larger by an amount that corresponds to the opening of the connection hole 30 and to the masking margin in the step of forming the connection hole 30 and the gate electrode 12. That is, the gate electrode 12, too, is formed in a shape like a dog bone. Furthermore, the terminal 12A has the same plane shape illustrated in the plan view as that of the portion 21A or 22A to which the signal wiring 21 or 22 is connected as will be described later in detail.

The gate electrodes 12 of the three complementary MISFETs of the standard cell 4 extend in the Y-direction (row direction, i.e., vertical direction in FIG. 3) and lie nearly in parallel with each other. The gate electrodes 12 (inclusive of terminals 12A) are composed of, for example, a polycrystalline silicon film into which impurities (P, As or B) are introduced to decrease the resistance. Further, the gate electrodes 12 may be composed of a single layer of a refractory metal (Mo, Ti, W, Ta) or a refractory-metal silicate (MoSi$_2$, TiSi$_2$, WSi$_2$, TaSi$_2$), or a composite film consisting of a polycrystalline silicon film and the above-mentioned metal film or the refractory-metal silicate film.

Furthermore, the standard cell 4 may be constituted by two, four or more complementary MISFETS.

The semiconductor elements in the standard cells 4 are connected by a wiring (not shown) formed by the step of forming wiring of the first layer. The connected standard cells 4 form a predetermined logic circuit or a part of the logic circuit, such as a NAND gate circuit, an F/F circuit, or the like.

Power source wirings (cell power source wirings) 210 are provided in the standard cells 4 as shown in FIG. 3. The power source wirings 210 are formed by the step of forming wirings of the first layer and extend in the X-direction (column direction). The power source wirings 210 consist of a power source voltage wiring (Vcc) and a reference voltage wiring (Vss). The power source voltage wiring extend on the p-channel MISFETs Qp or in the vicinities thereof to connect the p-channel MISFETs Qp of the standard cells 4 by a minimum length of connection. Similarly, the reference voltage wiring extends on the n-channel MISFETs Qn or in the vicinities thereof to connect the n-channel MISFETs Qn of the standard cells 4 by a minimum length of connection. The power source voltage wiring and the reference voltage wiring of the power source wirings 210 extend substantially in parallel with each other and apart from each other by a predetermined distance.

Though not shown, the power source wirings 210 are connected to power source main lines that extend on the input/output buffer circuits 3 or are connected to auxiliary power source main lines that extend on the standard cell array.

Figure 1:
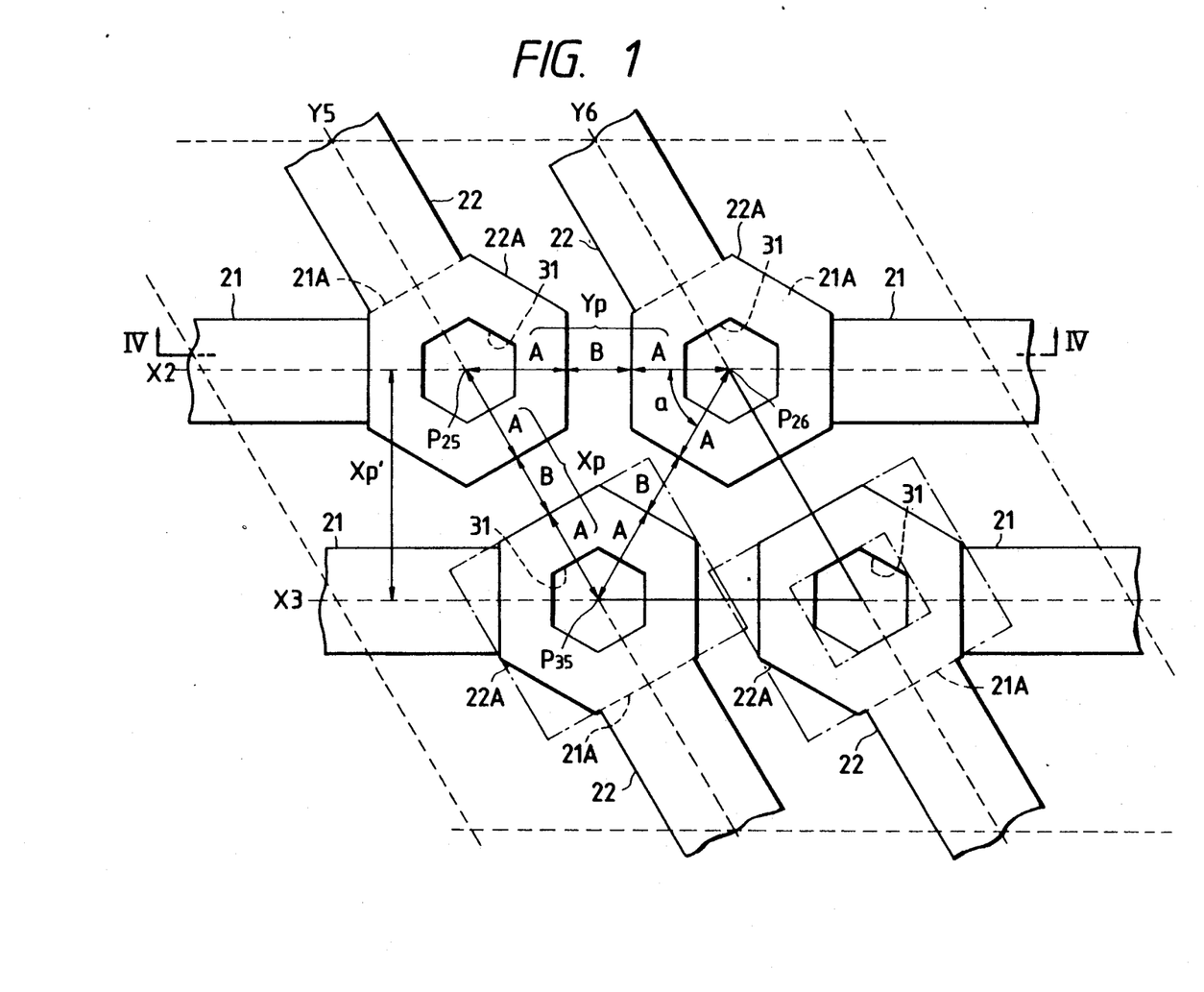
FIG. 1 is an enlarged plan view illustrating an essential part of a semiconductor integrated circuit device employing a master slice system of an embodiment I according to the present invention.
Figure 4:
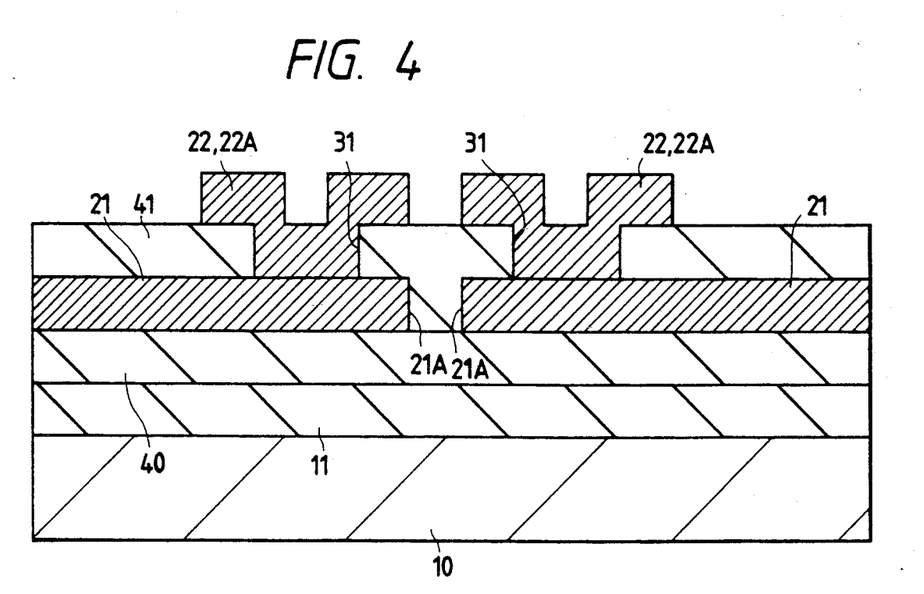
FIG. 4 is a sectional view illustrating an essential part, taken along the line IV—IV in FIG. 1.

The standard cells 4 or the logic circuits constituted by a plurality of standard cells 4 are connected together by the signal wirings 21 and 22 as shown in FIGS. 1 (plan view showing essential part on an enlarged scale), FIGS. 2, 3 and 4 (sectional view of essential part taken along the line IV—IV of FIG. 1).

The signal wirings 21 are formed on a first interlayer insulating film 40 as shown in FIG. 4. The first interlayer insulating film 40 is formed between the signal wirings 21 and the gate electrode 12, p+-type semiconductor region 14 and n+-type semiconductor region 13 of the standard cell 4 to electrically isolate them from each other. The first interlayer insulating film 40 is composed, for example, of a PSG film. Like the wirings in the standard cell 4 and the power source wirings 210, the signal wirings 21 are formed by the step of forming wirings of the first layer. As shown in FIGS. 2 and 3, the signal wirings 21 extend in the wiring channel regions 6 in the X-direction (column direction) and are arranged in a plurality of numbers in the Y-direction (row direction) at equal intervals (same pitch among the wirings). The wiring channel regions are formed on a LOCOS oxide film formed on the semiconductor substrate 10. The LOCOS oxide film has a thickness greater than that of the gate insulating films of the p-channel and n-channel MISFETs. Referring to FIG. 3, the signal wirings 21 are arranged at the positions corresponding to phantom lines (also center lines of the signal wirings 21) X1, X2 . . . in the X-direction of an X-Y lattice of the wiring channel region 6 imaginarily formed in a memory space of the automatic arranging/routing system. The X-Y lattice and phantom lines of the wiring channel region 6 are not really formed in the semiconductor integrated circuit device 1 (complete product) after the device processing has been finished, but are conveniently drawn on the drawings.

When, for example, a minimum work size for the signal wiring layer is 1.0 μm, the signal wirings 21 are formed with a width of 2.0 μm. The signal wirings 21 have a thickness of, for example, 1.0 μm.

The signal wirings 22 are formed on the interlayer insulating film 41 as shown in FIG. 4. The interlayer insulating film 41 is formed between the signal wirings 21 and the signal wirings 22 to electrically isolate them from each other. The interlayer insulating film 41 consists of, for example, three layers, e.g., P-SiO/SOG/P-SiO. The signal wirings 22 are formed by the step of forming wirings of the second layer. As shown in FIGS. 2 and 3, the signal wirings 22 extend on the wiring channel regions 6 and on the standard cells 4 in the Y-direction crossing the X-direction in which the signal wirings 21 extend, and are arranged in the X-direction at equal intervals (same pitch among the wirings). Referring to FIG. 3, the signal wirings 22 are arranged at the positions corresponding to phantom lines (also center lines of the signal wirings 22) Y1, Y2 . . . in the Y-direction of the X-Y lattice on the wiring channel regions 6 virtually formed in another memory space of the automatic arranging/routing system. The signal wirings 22 have, for example, a width of 2.0 μm and a thickness of 1.0 μm.

As shown in FIGS. 1 to 3, the center lines Y of the signal wirings 22 are tilted by a predetermined angle in the counterclockwise direction relative to a line that perpendicularly crosses the center lines X of the signal wirings 21. Concretely speaking, the center lines Y of the signal wirings 22 are tilted by 30 degrees in the counterclockwise direction. That is, the center lines Y of the signal wirings 22 intersect the center lines X of the signal wirings 21 at an acute angle (60 degrees) or at an obtuse angle (120 degrees).

In other words, as shown in FIG. 1, intersections of the center lines X2 and X3 of the two neighboring signal wirings 21 and the center lines Y5 and Y6 of the two neighboring signal lines 22, constitute a parallelogram. When the signal wirings 21 and the signal wirings 22 intersect at the aforementioned angle, there is formed a rhombus with all sides having the same length.

The intersecting points of the center lines X of the signal wirings 21 and of the center lines Y of the signal wirings 22 correspond to lattice points of the phantom lines in the X- and Y-directions imaginarily provided on the wiring channel regions 6 of the automatic arranging/routing system, and at which the signal wirings 21 and the signal wirings 22 can be electrically connected to one another. These connections are made through connection holes 31 formed in the interlayer insulating film 41.

The connection portions 21A of the signal wirings 21 have a size greater than the width of the signal wirings 21 by an amount that corresponds to at least the size of the connection holes 31 and to the masking margin in the step of forming the connection holes 31 and the signal wirings 21. That is, the signal wirings 21 have a so-called dog-bone shape and the connection portions 21A have the shape of a regular hexagon. In either the X-direction in which the signal wirings 21 extend and the Y-direction in which the signal wirings 22 extend, the connection holes 31 have an opening size of 2.0 μm, and the masking margin is assured to be 1.0 μm on the upper and lower sides and on the right and left sides of the connection holes 31. In this case, therefore, the connection portion 21A has a size of 4.0 μm in the X- and Y-directions (the wiring width A from the point where the center line X and the center line Y intersect to the end thereof is 2.0 μm. Furthermore, the connection portion 21A is separated by at least a minimum work size from the connection portion 21A of the another neighboring signal wiring 21. For example, when the minimum work size is 1.0 μm as described earlier, the distance between the neighboring connection portions 21A is 1.0 μm (corresponds to a minimum inter-wiring space B). That is, a wiring pitch Xp of the signal wirings 21 is determined by the width (2×A) of the connection portion 21A and the distance B between the connection portions 21A, and is set, in this case, to 5.0 μm.

Similarly, the connection portions 22A of the signal wirings 22 have a size greater than the width of the signal wirings 22 by an amount that corresponds at least to the opening size of the connection holes 31 and to the masking margin in the step for forming the connection holes 31 and the signal wirings 22. That is, the signal wirings 22 have a so-called dog-bone shape in the plan view and the connection portions 22A have the shape of a regular hexagon. In either the Y-direction in which the signal wirings 22 extend and the X-direction in which the signal wirings 21 extend, the connection holes 31 have an opening size of 2.0 μm, and the margin is assured is to be on the upper and lower sides and on the right and left sides of the connection-holes 31. In this case, therefore, the connection portion 22A has a size of 4.0 μm in the X- and Y-directions (the wiring width A from the point where the center line X and the center line Y intersect to the end thereof is, likewise, 2.0 μm). Furthermore, the connection portion 22A is separated by at least a minimum work size from the connection portion 22A of the another neighboring signal wiring 22. For example, when the minimum work size is 1.0 μm like the case described above, the distance between the neighboring connection portions 22A is 1.0 μm (corresponds to a minimum space B among the wirings). That is, a pitch Yp between the signal wirings 22 is determined by the width (2×A) of the connection portion 22A and the distance B between the connection portions 22A, and is set, in this case, to 5.0 μm like that of the signal wirings 21.

The connection portions 21A of the signal wirings 21 and the connection portions 22A of the signal wirings 22 have a plane of a regular hexagonal shape as shown in FIG. 1. Similarly, the connection holes 31 have a regular hexagonal shape which is a similar figure of that of the connection portions 21A and 22A. If the signal wirings 21 and 22 are intersected by each other at an acute angle or at an obtuse angle, the pitch between the wirings decreases at connection portions of a square shape as indicated by dot-dash lines in FIG. 1, and distances decrease between the connection portions 21A and between the connection portions 22A that are neighboring to each other in the direction of the wiring pitch. That is, the planes of the connection portions 21A and the connection portions 22A have a regular hexagonal shape as a result of cutting off the contacting portions between the connection portions 21A and between the connection portions 22A that are neighboring to each other in the direction of the wiring pitch. According to a design rule (in order to maintain space B among the wirings), the connection hole 31 have a regular hexagonal plane shape viewed from above. This results from cutting off the corner portions, based upon the design rule between the connection holes 31 and the connection portions 21A, 22A that have the regular hexagonal shape (in order to maintain a masking margin). The regular hexagonal shape can be easily formed since it consists of angles (0, 30, 45, 60, 90) that can be easily handled by the automatic arranging/routing system or the electron beam drawing apparatus as mentioned later.

When the signal wirings 21 and the signal wirings 22 intersect each other at an acute angle or at an obtuse angle as shown in FIG. 1, the intersecting points P of center lines X of the neighboring signal wirings 21 and center lines Y of the neighboring signal wirings 22, constitute a regular triangle. For example, a regular triangle is formed if an intersecting point (vertex) $P_{25}$ of center line X2 of the signal wiring 21 and center line Y5 of the signal wiring 22, an intersecting point P 26 of center line X2 and center line Y6, and an intersecting point $P_{35}$ of center line X3 and center line Y5 are connected together with straight lines. That is, the signal wirings 21 and the signal wirings 22 intersect at an acute angle of 60 degrees or at an obtuse angle of 120 degrees, and the distances between the intersecting points $P_{25}$ and $P_{26}$ between the intersecting points $P_{26}$ and $P_{35}$ and between the intersecting points $P_{35}$ and $P_{25}$ correspond to the wiring pitch Xp between the signal wirings 21 and to the pitch Yp between the signal wirings 22, which are all equal to each other. In other words, the intersecting point P ($P_{26}$) which is neighboring in the X-direction and the intersecting point P ($P_{35}$) neighboring in the Y-direction are all arranged at positions that are the same as viewed from one intersecting point P (e.g., $P_{25}$). This arrangement of the intersecting points P makes it possible to minimize the average distance between adjacent intersecting points and, hence, to minimize the distances among the intersecting points in both the X-direction and the Y-direction.

Furthermore, the intersecting points P are arranged in the X- and Y-directions in a zig-zag manner.

Thus, with the signal wirings 22 intersecting the signal wirings 21 at an acute angle or at an obtuse angle, the wiring pitch Xp of the signal wirings 21 is equal to the wiring pitch Yp of the signal wirings 22 on the center lines Y as shown in FIG. 1. However, since the center lines Y intersect the center lines X at an acute angle or at an obtuse angle, the wiring pitch Xp' becomes substantially small on the lines that intersect the center lines X of the signal wirings 21 at right angles. That is, in the aforementioned case, the wiring pitch Xp' is found according to the following equation.

$$\text{Wiring pitch: } Xp' = Xp \cdot \sin 60$$
$$= 5.0 \times \sqrt{3}/2$$
$$= 4.33$$

As shown in FIG. 3, furthermore, the terminals 12A (which correspond to input signal terminals of the logic circuit) of the standard cells 4 and the signal wirings 21 or the signal wirings 22 are connected together with a structure which is the same type of structure as that connecting the signal wirings 21 and the signal wirings 22 together. That is, the terminals 12A have a plane of a regular hexagonal shape and the connection holes 30 have a plane of a regular hexagonal shape which is similar to the that of terminals 12A. The connection portions of the signal wirings 21 and the connection portions of the signal wirings 22 connected to the terminals 12A each have the same structure as that as the connection portions 21A and 22A described above in conjunction with FIG. 1.

Further, the signal wirings 22 are tilted at an acute angle or at an obtuse angle relative to the signal wirings 21, and the standard cells 4 are constituted by the semiconductor elements basically along an X-Y orthogonal coordinate system except the terminals 12A that serve as interfaces. That is, referring to FIG. 3, the standard cells 4 are so arranged that the planes of the gate electrodes 12 of p-channel MISFETs Qp, p-type semiconductor regions 14, gate electrodes 12 of n-channel MISFETs Qn, and n-type semiconductor regions 13 are in parallel with the center lines X of the signal wirings 21 and in parallel with the lines that intersect the center lines X at right angles therewith. With the semiconductor elements of the standard cells 4 constituted along the X-Y orthogonal coordinate system as described above, it is possible to prevent the acute-angled portions of the semiconductor elements from being locally oxidized or etched during the device processing and, hence, to improve their electric characteristics.

Namely, in the semiconductor integrated circuit device 1 employing a master slice system, there are provided the signal wirings 22 on the signal wirings 21 that extend in the X-direction and that are arranged in a plural number with predetermined intervals therebetween, the signal wirings 22 extending in the Y-direction to intersect the X-direction and being arranged in a plural number and spaced at predetermined intervals, and the signal wirings 21 and the signal wirings 22 are electrically connected together at the intersecting portions of the signal wirings 21 and the signal wirings 22, wherein the Y-direction in which the signal wirings 22 extend defines an acute angle or an obtuse angle with respect to the X-direction in which the signal wirings 21 extend as shown in FIG. 1. The acute angle is 60 degrees and the obtuse angle is 120 degrees. All of the plurality of signal wirings 22 intersect the signal wirings 21 at the acute angle or at the obtuse angle. Owing to this constitution, the wiring pitch of the signal wirings 21 extending in the X-direction can be reduced to Xp' as shown in FIG. 1 in order to reduce the area occupied by the wiring-forming region 6 where the signal wirings 21 are formed. It is therefore possible to increase the degree of integration of the semiconductor integrated circuit device 1 that employs the master slice system. Basically, this constitution is adapted within the standard cell array of the semiconductor integrated circuit device 1 that employs the master slice system. This constitution, however, can also be adapted to the peripheral region of the standard cell array, i.e., to the wiring-forming region between the standard cells 4 and the input/output buffer circuits 3.

Furthermore, in the semiconductor integrated circuit device 1 employing a master slice system, there are provided two signal wirings 22 on the two signal wirings 21 that extend nearly in parallel in the X-direction, the two signal wirings 22 extending nearly in parallel in the Y-direction that intersects the X-direction, and the signal wirings 21 and the signal wirings 22 are electrically connected together at the intersecting portions of the signal wirings 21 and the signal wirings 22, wherein, as shown in FIG. 1, the distances are set to be nearly the same among the intersecting point $P_{25}$ of the center line X2 of one signal wiring 21 of the two signal wirings 21 and the center line Y5 of one signal wiring 22 of the two signal wirings 22, the intersecting point $P_{26}$ of the center line x2 of said one signal wiring 21 and the center line Y6 of the other signal wiring 22 of the two signal wirings 22, and the intersecting point $P_{35}$ of the center line X3 of the other signal wiring 21 of the two signal wirings 21 and the center line Y6 of the other signal wiring 22. These intersecting points $P_{25}$, $P_{26}$ and $P_{35}$ are vertexes of a regular triangle that is formed by connecting these intersecting points. The signal wirings 21 have connection portions 21A and the signal wirings 22 have connection portions 22A at the intersecting points $P_{25}$, $P_{26}$, $P_{35}$ where the signal wirings 21 and the signal wirings 22 are electrically connected together. The connection portions 21A and the connection portions 22A have a regular hexagonal shape in the plan view. Owing to this constitution, the distances among the intersecting points $P_{25}$, $P_{26}$ and $P_{35}$ are averaged, and the wiring pitch Xp of the signal wirings 21 extending in the X-direction is reduced to the wiring pitch Xp'. Therefore, the area can be reduced that is used for provision of the wiring channel region 16 in FIGS. 2 and 3, where the signal wirings 21 are arranged, and it is possible to increase the degree of integration of the semiconductor integrated circuit device 1 that employs the master slice system.

Figure 5:
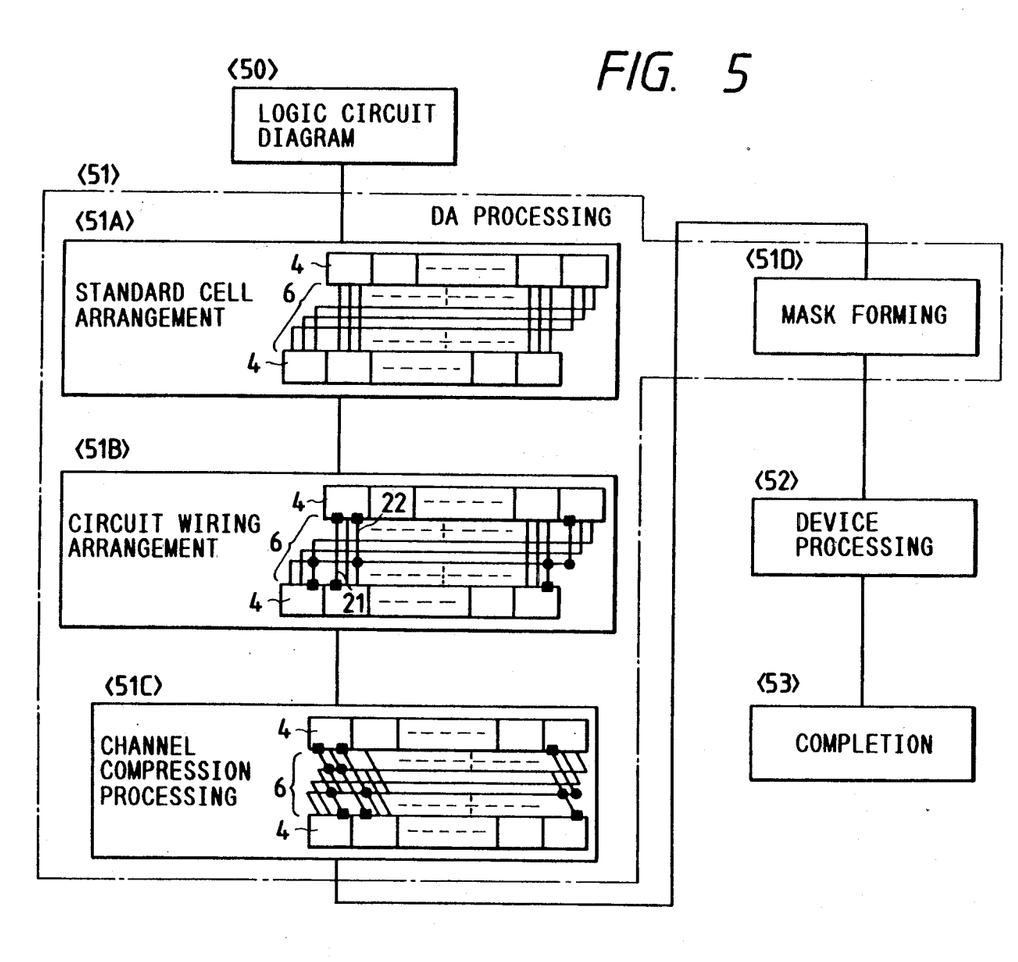
FIG. 5 is a diagram of a process flow for explaining a method of forming the semiconductor integrated circuit device.

The method of forming the semiconductor integrated circuit device 1 that employs the master slice system will now be briefly described in conjunction with FIG. 5 (diagram of process flow).

First, a logic is designed that is to be mounted on the semiconductor integrated circuit device 1 to prepare a logic circuit diagram.

Next, based on the logic circuit diagram, the logic circuits are arranged and connected automatically [51] by the automatic arranging/routing system (DA) using a computer. Based on the logic circuit diagram, first, the connection data are input to the automatic arranging/routing system, the connection data (NET FILE) being presumed to be the ones that can be handled with the automatic arranging/routing system.

Then, a standard cell pattern and major power source wirings are automatically arranged [51A] on the semiconductor integrated circuit device (base chip) that is stored in the base data of the automatic arranging/routing system and that is imaginarily expressed. The standard cell pattern and the like have been stored as fixed patterns in the base data. Furthermore, X-Y lattice-like phantom lines are set on the region that corresponds to the wiring channel region 6. At this moment, the X-Y lattice-like wiring channel region is so set that the Y-direction wiring channel region intersects the X-direction wiring channel region at right angles. Even when the Y-direction wiring channel region is tilted in the X-Y lattice-like wiring channel region by the aftertreatment, the Y-direction wiring channel region is set being deviated in one direction by the wiring pitch for every intersection with the X-direction wiring channel region, such that the terminals 12A of the basic cells 4 at corresponding positions of the two opposing standard cell columns 5 can be connected by the Y-direction wiring channel region.

Next, the designed logic circuits are automatically arranged and are automatically connected together via signal wirings based on the connection data input to the automatic arranging/routing system [51B]. The logic circuits are automatically arranged by automatically arranging the modules (connection pattern of logic circuits) stored in the base data of the automatic arranging/routing system along the standard cell pattern. The signal wirings are automatically arranged along the X-Y lattice-like wiring channel region using an algorithm. The signal wirings arranged on the X-direction wiring channel region and the signal wirings arranged on the Y-direction wiring channel region are connected to each other at lattice points on the X-Y lattice-like wiring channel region. The logic circuit data are completed by automatically arranging the logic circuits and the signal wirings.

Next, the channel compression processing (channel folding processing) is effected for the X-Y lattice-like wiring channel region [51C]. The channel compression processing is of tilting the Y-direction wiring channel region relative to the X-direction wiring channel region in the X-Y lattice-like wiring channel region to compress the distance among the X-direction wiring channel regions. As described above, therefore, the distance among the X-direction wiring channels (wiring pitch) is compressed in the X-Y lattice-like wiring channel region. As for the X-Y lattice-like wiring channel region imaginarily set in a memory space of the automatic arranging/routing system, positions of the signal wirings are basically stored but the channel regions are not practically tilted by the channel compression processing. That is, when the mask for connection is prepared based on the data of signal wirings for which the channel compression processing is effected, the pattern of signal wirings is tilted, the signal wirings extending to the positions of the mask for connecting on the Y-direction wiring channel region.

Next, the logic circuit data completed by the automatic arranging/routing system are converted by the automatic arranging/routing system into data for preparing the mask based on the design rules. Then, based on the data for preparing the mask, the mask for connection (mask for production) is formed by the electron beam (EB) lithography system [51D]. The process is carried out automatically by the automatic arranging/routing system from a step for inputting the connection data through up to a step for converting the data into data for preparing the mask.

Then, using the mask for connection, the device processing is effected [52] to substantially complete the semiconductor integrated circuit device 1 on which a predetermined logic is mounted [53].

In the semiconductor integrated circuit device 1 employing the master slice system, furthermore, the signal wirings 22 that extend in the Y-direction on the wiring forming region 6 may intersect the signal wirings 21 that extend in the X-direction at an angle of 30 degrees (or 150 degrees) or at an angle of 45 degrees (or 135 degrees) in addition to the angle of 60 degrees.

Moreover, the connection portions 21A of the signal wirings 21 and the connection portions 22A of the signal wirings 22 may have a regular octagonal shape or a regular polygonal shape.

In the semiconductor integrated circuit device 1 employing the master slice system, furthermore, the center lines Y of the signal wirings 22 only are tilted. However, it is also allowable to tilt the center lines X of the signal wirings 21 as well as the center lines Y of the signal wirings 22.

Described below is a second embodiment of the present invention in which the connection portions of the signal wirings and the connection holes among the signal wirings have different shapes in the semiconductor integrated circuit device that employs the master slice system.

Figure 6:
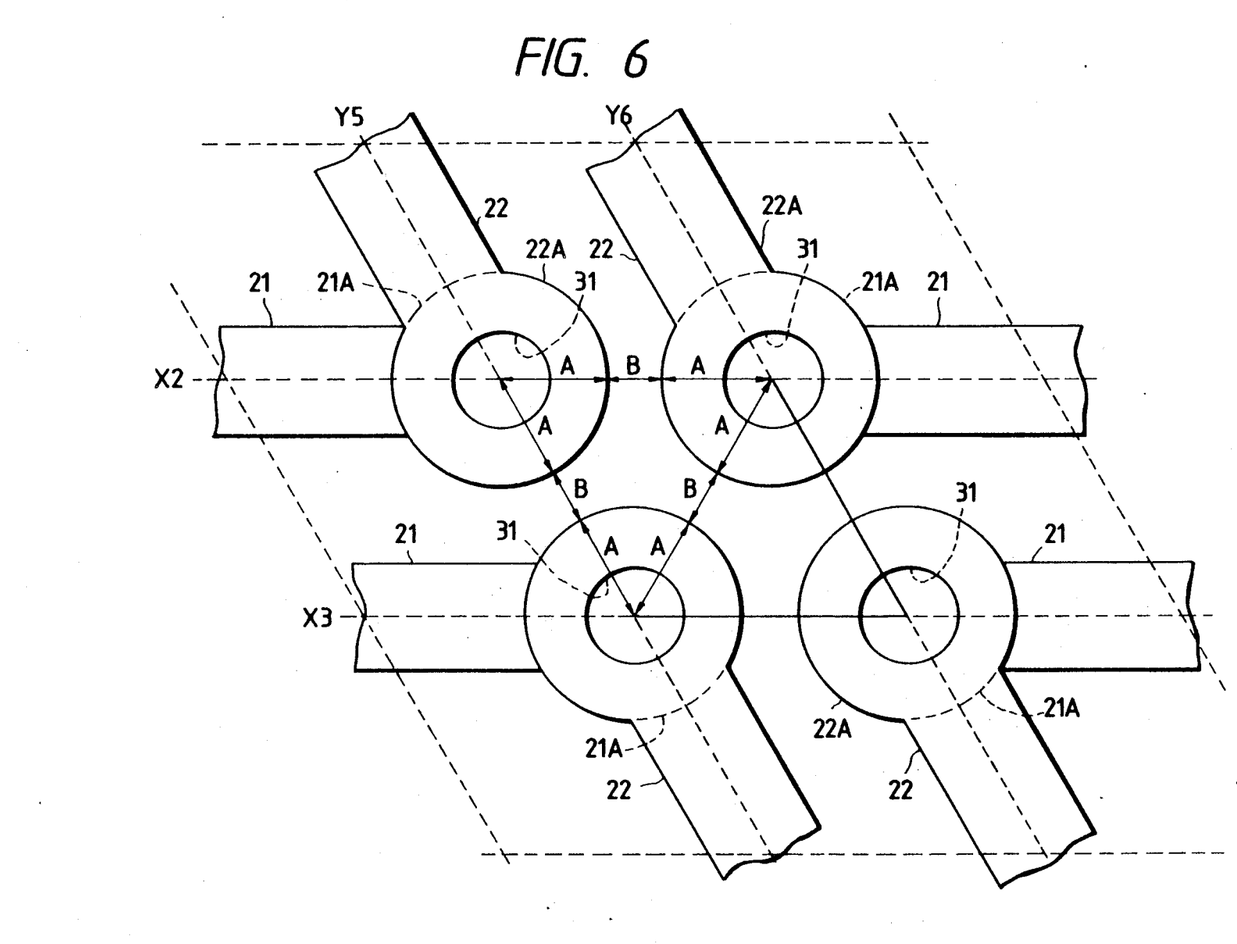
FIG. 6 is an enlarged plan view illustrating an essential part of a semiconductor integrated circuit device employing a master slice system of an embodiment II according to the present invention.

FIG. 6 (an enlarged plan view illustrating a major portion) shows the wiring channel region of the semiconductor integrated circuit device that employs the master slice system according to the is embodiment II of the present invention.

In the semiconductor integrated circuit device 1 employing the master slice system according to the embodiment II as shown in FIG. 6, the connection portions 21A of the signal wirings 21 extending in the X- direction and the connection portions 22A of the signal wirings 22 extending in the Y-direction have circular shapes. The connection holes 31 that electrically connect the signal wirings 21 and the signal wirings 22 together have a circular shape which is similar to the shape of the connection portions 21A and 22A.

The semiconductor integrated circuit device 1 employing the master slice system constituted as described above exhibits nearly the same effects as those of the aforementioned embodiment I.

Described below is a third embodiment of the present invention according to which the semiconductor integrated circuit device employing the master slice system is formed by a different method.

Figure 7:
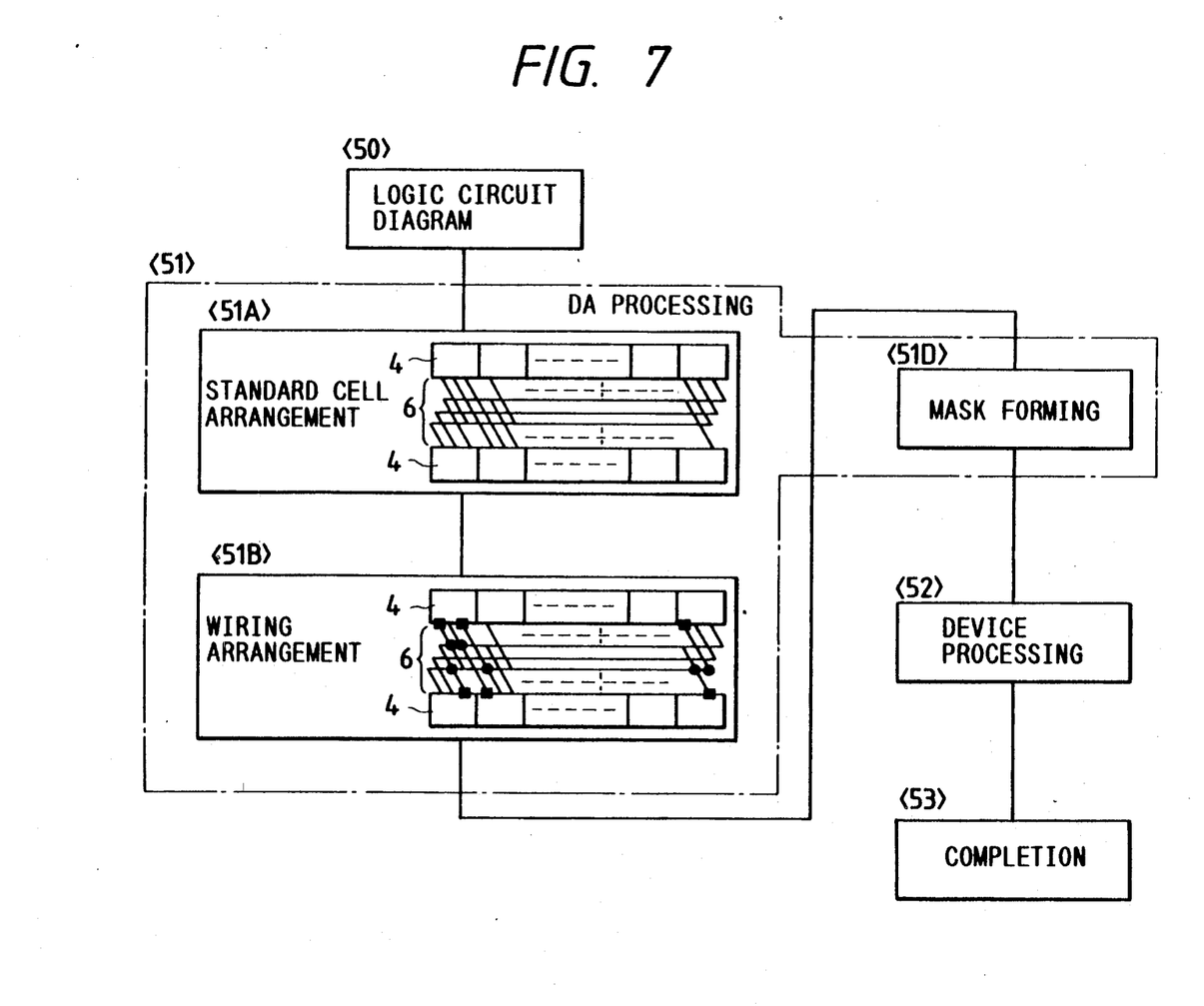
FIG. 7 is a diagram of a process flow for explaining a method of forming a semiconductor integrated circuit device that employs a master slice system of an embodiment III according to the present invention.

FIG. 7 (process flow diagram) illustrates a method of forming the semiconductor integrated circuit device employing the master slice system according to the embodiment III.

According to the method of forming the semiconductor integrated circuit device 1 employing the master slice system of the embodiment III as shown in FIG. 7, the Y-direction wiring channel regions are tilted in advance in the X-Y lattice-like wiring channel region (the X-Y lattice-like wiring channel region is set in which the Y-direction wiring channel regions are tilted) by the automatic arranging/routing system [51A], and the signal wirings are automatically arranged on the tilted X-Y lattice-like wiring channel region [51B]. The other steps are nearly the same as those of the aforementioned embodiment I.

The thus constituted semiconductor integrated circuit device 1 employing the master slice system exhibits nearly the same effects as those of the aforementioned embodiment I.

In the foregoing several embodiments of the invention were concretely described. However, the invention is in no way limited to only the aforementioned embodiments, but can be modified in a variety of other ways without departing from the spirit and scope of the invention.

For instance, the present invention can be adapted to a semiconductor integrated circuit device employing the master slice system of a structure having signal wirings of three or more layers.

The present invention can further be adapted to a semiconductor integrated circuit device employing a master slice system of the spread-all-over type which does not have the wiring channel region but in which the standard cells are densely arranged in a matrix.

Moreover, the present invention can be adapted to a semiconductor integrated circuit device employing the master slice system in which the standard cells are constituted by bipolar transistors, or by bipolar transistors and complementary MISFETS.

Further, the present invention can be adapted to printed wiring boards whose wiring structures are made with the automatic arranging/routing system.

Among the inventions disclosed in this application, a typical example exhibits the effects as described below briefly.

That is, in the semiconductor integrated circuit device employing the master slice system, the area occupied by the wiring channel regions is reduced so as to increase the degree of integration.

We claim:

1. A semiconductor integrated circuit device comprising:
    a semiconductor substrate;
    a plurality of basic cell columns provided on a main surface of said semiconductor substrate, each of said basic cell columns being constituted by a plurality of MISFETs;
    a plurality of wiring channel regions provided between said plurality of basic cell columns;
    first wirings along first phantom lines, said first wirings are provided in said wiring channel regions and said first phantom lines extend in a first direction;
    second wirings along second phantom lines, said second wirings are provided in said wiring channel regions and said second phantom lines extend in a second direction inclined by an acute angle with respect to said first direction, wherein no wirings extending in a third direction which is perpendicular to said first direction exist in said wiring channel regions; and
    means electrically interconnecting first and second wirings at connection portions thereof.

2. A semiconductor integrated circuit device according to claim 1, wherein said basic cell columns extend in said first direction.

3. A semiconductor integrated circuit device according to claim 2, wherein said acute angle is 60 degrees.

4. A semiconductor integrated circuit device according to claim 2, said means electrically interconnecting comprising:
    first connection portions provided at the ends of said first wirings;
    second connection portions provided at the ends of said second wirings; and connection holes provided in a first insulating film interposed between said plurality of first and second wirings, wherein said first wirings and said second wirings are electrically connected together at said first and second connection portions through the connection holes.

5. A semiconductor integrated circuit device according to claim 4, wherein at least either the first connection portions or the second connection portions have regular hexagonal shapes.

6. A semiconductor integrated circuit device according to claim 5, wherein said acute angle is 60 degrees.

7. A semiconductor integrated circuit device according to claim 4, wherein at least either the first connection portions of the second connection portions have circular shapes.

8. A semiconductor integrated circuit device according to claim 2, wherein said MISFETs have gate electrodes, source regions and drain regions, and said gate electrodes extend in said third direction which is perpendicular to said first direction.

9. A semiconductor integrated circuit device according to claim 8, wherein said acute angle is 60 degrees.

10. A semiconductor integrated circuit device according to claim 1, wherein said first and second wirings are made of aluminum.

11. A semiconductor integrated circuit device comprising:
    a semiconductor substrate;
    a plurality of basic cell columns provided on a main surface of said semiconductor substrate, said basic cell columns comprising a plurality of MISFETs;
    a plurality of wiring channel regions provided among the plurality of basic cell columns;
    a plurality of first wirings which are provided in said wiring channel regions and which extend in a first direction, wherein said first wirings have first connection portions at respective ends of said first wirings;
a plurality of second wirings which are provided in said wiring channel regions and which extend in a second direction inclined by an acute angle with respect to said first direction, wherein said second wirings have second connection portions at respective ends of said second wirings; and
means electrically interconnecting said first and second connection portions, wherein said first and second connection portions have regular hexagonal shapes.

12. A semiconductor integrated circuit device according to claim 11, wherein said acute angle is 60 degrees.

13. A semiconductor integrated circuit device according to claim 11, wherein said MISFETs have gate electrodes, source regions and drain regions, and said gate electrodes extend in a third direction which is perpendicular to said first direction.

14. A semiconductor integrated circuit device according to claim 11, wherein said first and second wirings are made of aluminum.

* * * * *